United States Patent [19]
Silfvast et al.

[11] Patent Number: 6,031,241
[45] Date of Patent: Feb. 29, 2000

[54] CAPILLARY DISCHARGE EXTREME ULTRAVIOLET LAMP SOURCE FOR EUV MICROLITHOGRAPHY AND OTHER RELATED APPLICATIONS

[75] Inventors: William T. Silfvast, St. Helena, Calif.; Mark A. Klosner, Orlando; Gregory M. Shimkaveg, Oviedo, both of Fla.

[73] Assignee: University of Central Florida, Orlando, Fla.

[21] Appl. No.: 09/001,696

[22] Filed: Dec. 31, 1997

Related U.S. Application Data

[63] Continuation-in-part of application No. 08/815,283, Mar. 11, 1997.

[51] Int. Cl.$^7$ ..................................................... G21G 4/00
[52] U.S. Cl. ..................................... 250/504 R; 250/493.1
[58] Field of Search ........................... 250/504 R, 493.1; 378/119

[56] References Cited

U.S. PATENT DOCUMENTS

| | | | |
|---|---|---|---|
| 4,229,708 | 10/1980 | Mani et al. | 331/94.5 G |
| 4,441,189 | 4/1984 | Macklin | 372/76 |
| 4,538,291 | 8/1985 | Iwanatsu | 378/119 |
| 4,574,198 | 3/1986 | Lucas et al. | 250/493.1 |
| 4,592,056 | 5/1986 | Elyon | 372/5 |
| 4,860,328 | 8/1989 | Frankel et al. | 378/34 |
| 4,872,189 | 10/1989 | Frankel et al. | 378/119 |
| 4,937,832 | 6/1990 | Rocca | 372/76 |
| 5,117,432 | 5/1992 | Nilsen | 372/5 |
| 5,177,774 | 1/1993 | Suckewer et al. | 378/43 |
| 5,243,638 | 9/1993 | Wang et al. | 378/119 |
| 5,327,475 | 7/1994 | Golovanivsky et al. | 378/34 |
| 5,499,282 | 3/1996 | Silvfast | 378/119 |

OTHER PUBLICATIONS

Review on Corrosion Phenomena in Molten Lithium, P.A. Steinmeyer, et al., pp 349–434.
Degradation of Silicon Carbide by Molten Lithium, James W. Cree, et al. Communications of the American Ceramic Society, Nov. 1987, pp C–318 –C321.
Compatibility of Ceramics with Liquid Na And Li, R. N. Singh, Journal of the American Ceramic Society, Vol. 59, No. 3–4 pp 112–114.
Wavelength Considerations in Solft–X–Ray Projection Lithography, Andrew M. Hawryluk, et al., Applied Optics, Vol 32, No. 34, 1 Dec. 1993, pp. 7062–7067.
Molybdenuimberyllium Multilayer Mirrors for Normal Incidence in the Extreme Ultraviolet, K.M. Skulina, et al., Applied Optics, Vol. 34, No. 19, 1 Jul. 1995, pp. 3727 – 3730.
Marconi, et al., Time–Resolved Extreme Ultraviolet Emission From a Big Ionized Lithium Capillary Discharge, Applied Physics Letters, 54(22), May, 1989, pp. 2180–2182.
Rocca, et al., Study of the Soft X–Ray Emission From Carbon Ions in Capillary Discharge, IEEE Journal Quantum Electronics, Vol. 29 #1, Jan. 1983, pp. 3774–3777.

(List continued on next page.)

*Primary Examiner*—Kiet T. Nguyen
*Attorney, Agent, or Firm*—Brian S. Steinberger; Law Offices of Brian S. Steinberger

[57] ABSTRACT

Capillary discharge extreme ultraviolet lamp sources for EUV microlithography and other applications. The invention covers operating conditions for a pulsed capillary discharge lamp for EUVL and other applications such as resist exposure tools, microscopy, interferometry, metrology, biology and pathology. Techniques and processes are described to mitigate against capillary bore erosion, pressure pulse generation, and debris formation in capillary discharge-powered lamps operating in the EUV. Additional materials are described for constructing capillary discharge devices fore EUVL and related applications. Further, lamp designs and configurations are described for lamps using gasses and metal vapors as the radiating species.

31 Claims, 10 Drawing Sheets

OTHER PUBLICATIONS

Silfvast, et al., Laser Plasma Source Charactization for SXPL, OSA Proceedings on Soft–X–Ray Proj.Lithog. Vol 18, Jan. 1994, pp. 117–126.

Nagata, et al., Soft–X–Ray Amplification of the Lyman Transition by Optical–Field–Induced Ionization, American Physical Society, Vol. 71, #23, Dec. 1983, pp. 3774–3777.

Silfvast, William T., Development of Efficient Narrow Spectral Width Soft–X–Ray Sources at 13.5 NM, Creol, University of Central Florida, Jan. 1994, pp. 1–5.

He–CD Lasers Using Recirculations Geometry, Karl, G. HernQvist, *IEEE Journal of Qunatum Electronics,* vol. Qe–9, Sep. 1972, pp 740–743.

Xenon emission spectra,
1 Torr Xe at different discharge currents

Spectrum of oxygen emission from capillary discharge

Intensity of oxygen emission at 13 nm versus pressure
6000 Amperes peak current

Experimental arrangement for obtaining spectral data

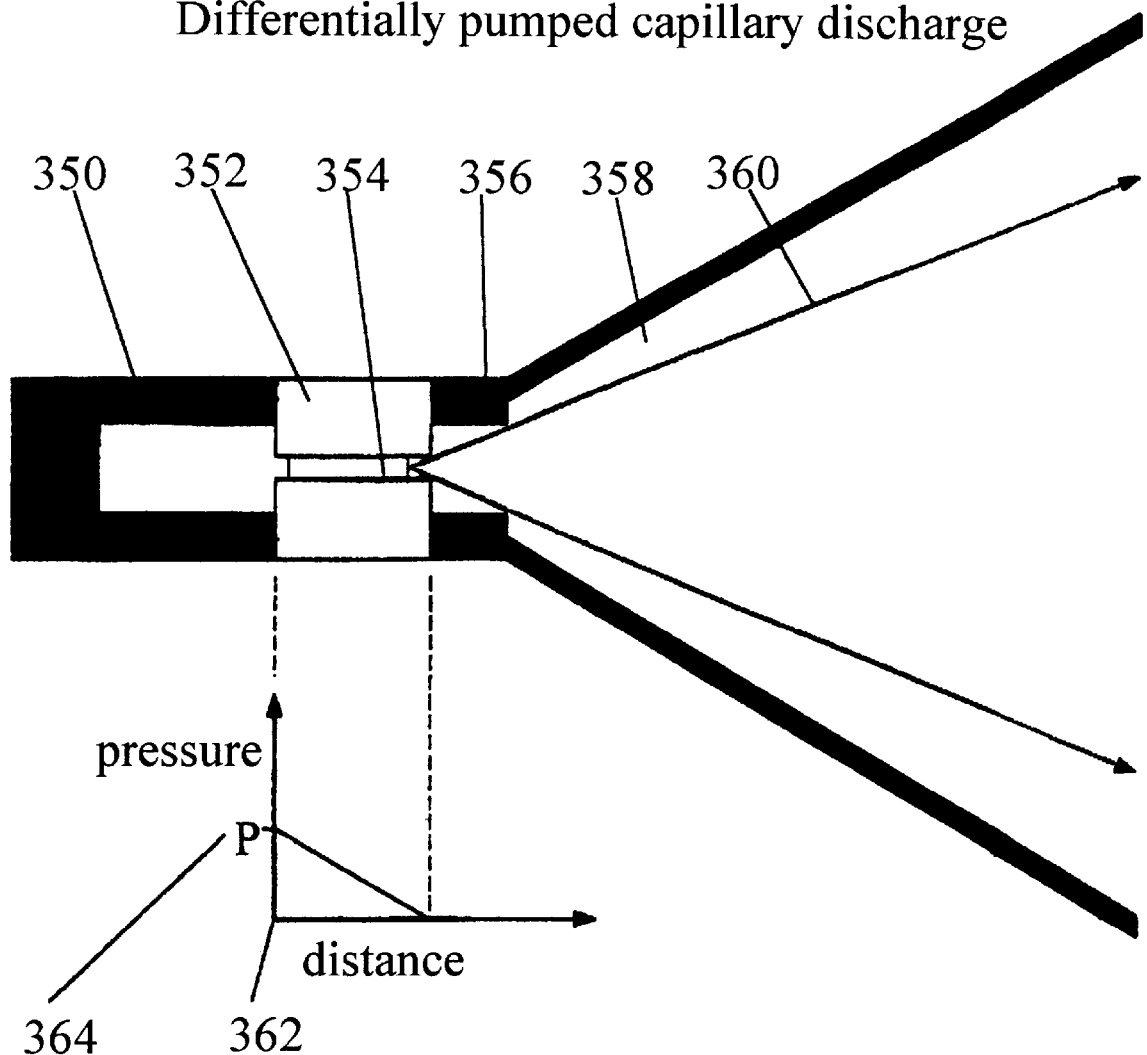

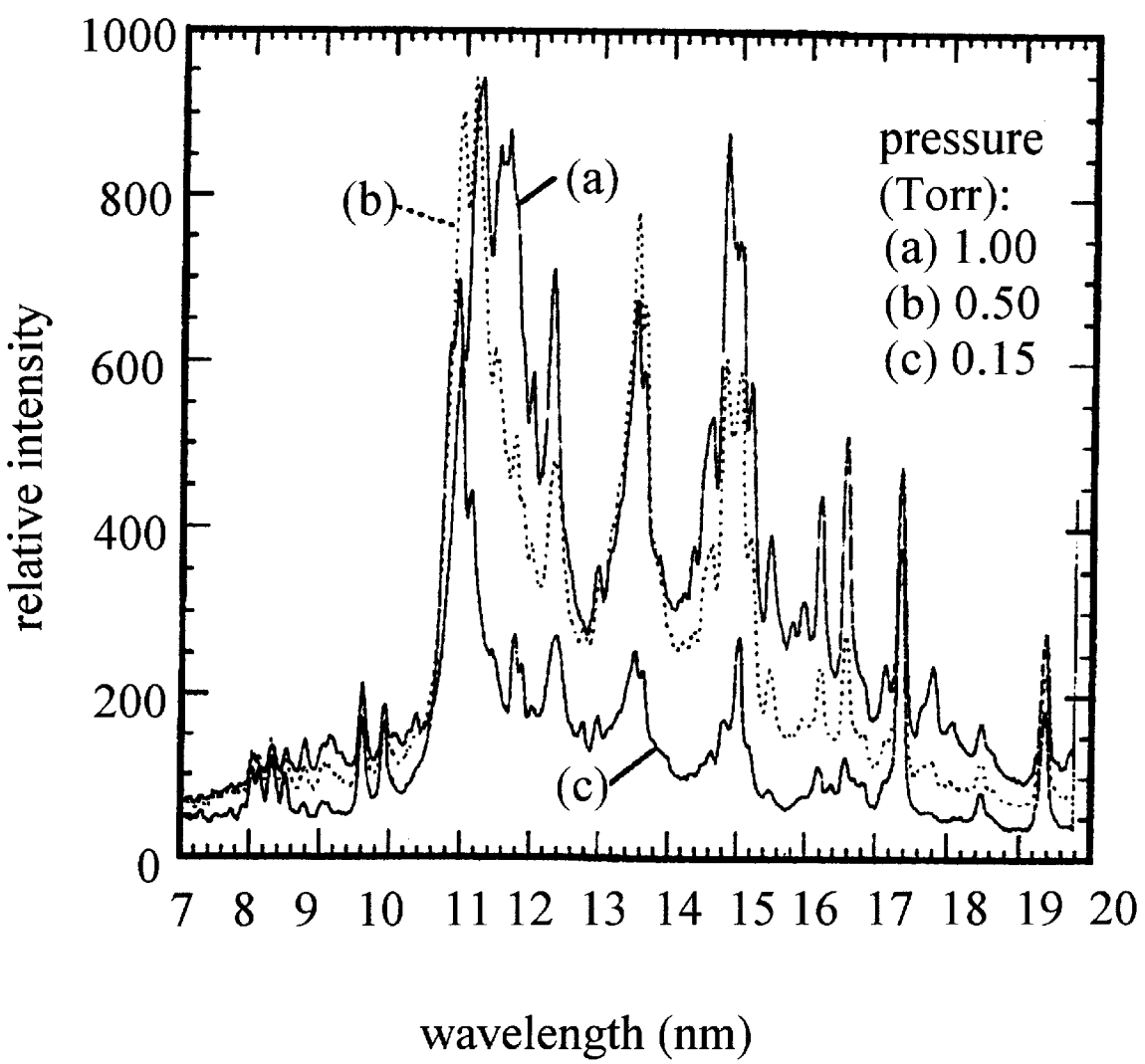

Impulse measured at 10 cm from new AlN capillaries

Laser heat treatment of capillary bore

CAPILLARY DISCHARGE EXTREME ULTRAVIOLET LAMP SOURCE FOR EUV MICROLITHOGRAPHY AND OTHER RELATED APPLICATIONS

This invention is a Continuation-In-Part of U.S. Application Ser. No. 08/815,283 filed on Mar. 11, 1997. This invention is further related to U.S. Pat. No. 5,499,282 to William T. Silfvast issued on Mar. 12, 1996, which is incorporated by reference.

This invention relates to capillary discharges for use as imaging sources in Extreme Ultraviolet Lithography (EUVL) and other technologies such as EUV microscopy, interferometry, inspection, metrology, and the like. The invention describes characteristics of sources that radiate intense light in the wavelength region between 10 and 14 nm. The operation of these sources can be determined by: (1) the gas or vapor pressure within the capillary which generates optimum emission flux; (2) the range of discharge currents at which sufficient radiation flux occurs but above which significant detrimental debris and bore erosion begins; (3) the desired range of capillary bore sizes and lengths, some specific gaseous media that radiate effectively in the capillary discharges under the conditions described above, and (4) two specific configurations for housing the capillary discharge system.

BACKGROUND AND PRIOR ART

A commercially suitable Soft-X-Ray (or EUV) lithography facility will require an intense soft x-ray/EUV light source that can radiate within a specific wavelength region of approximately 11 to 14 nm in the EUV part of the electromagnetic spectrum. This region is determined by the wavelength range over which high reflectivity multilayer coatings exist. The multilayer coatings can be used to manufacture mirrors which can be integrated into EUVL stepper machines. Specifically, these coatings are either Mo:Be multilayer reflective coatings (consisting of alternate ultrathin layers of molybdenum and beryllium) which provide high reflectivity between 11.2 and 12.4 nm, or Mo:Si multilayer reflective coatings (consisting of alternate ultrathin layers of molybdenum and silicon) which provide high reflectivity between 12.4 nm and 14 nm. Thus any intense EUV source emitting in the wavelength range of 11–14 nm may be applicable to lithography. Two proposed EUV sources are synchrotrons which generate synchrotron radiation and soft-x-ray emitting laser-produced plasmas (LPP's). Synchrotron sources have the following drawbacks: the synchrotron and synchrotron support facilities cost up to $100 million or more; together they occupy a space of approximately 1,000,000 cubic feet. Such a volume is incompatible with a typical microlithography fabrication line. Laser produced plasmas that have the necessary wavelength and flux for a microlithography system require a high power laser to be focused onto a target material such that sufficient plasma density can be produced to efficiently absorb the incident laser radiation. Laser produced plasmas have the following drawback: if a solid target material is used, the interaction of the focused laser beam with the target produces an abundant quantity of debris which are ejected from the laser focal region in the form of atoms, ions, and particulates. Such ejecta can accumulate on and thereby damage the optics that are used in collecting the light emitted from the plasma. The use of volatile target materials in LPP sources has been successful in overcoming the debris problem. A volatile target material is simply a material which is unstable to evaporation in a room temperature vacuum, examples of these are liquified or solidified gases such as oxygen or xenon, and also liquids such as water. For these materials, any bulk mass not directly vaporized by the laser pulse will evaporate and will be subsequently pumped away. Thus the excess target material does not collect or condense on the optics.

Although such laser-produced plasma sources have been developed for EUVL using oxygen and xenon as radiating species, there still exist two prohibitive drawbacks for which no realistic scenarios of significant improvement have been proposed. First, the total electrical efficiency of such sources is of the order of only 0.005–0.025%. This results from considering the multiplicative combination of the laser efficiency, which is of the order of 1–5%, and the conversion efficiency of laser light to useful EUV radiation (within the reflectivity bandwidth of a multilayer-coated reflecting mirror) of approximately 0.5%. Second, the cost of a laser that would necessarily operate at repetition rates of over 1 kHz would be a minimum of several million dollars.

To overcome the unique problems specific to the synchrotron sources and to the LPP sources we have invented a compact electrically produced intense capillary discharge plasma source which could be incorporated into an EUV lithography machine. Compared to synchrotrons and LPP's this source would be significantly more efficient, compact, and of lower cost (both to manufacture and to operate). We envision that one of these sources (along with all the necessary support equipment) would occupy the space of less than 10 cubic feet and would cost less than $100,000. One such embodiment of the proposed capillary discharge source was first described in U.S. Pat. No. 5,499,282 by William T. Silfvast issued on Mar. 12, 1996. That particular proposed source would operate in a lithium vapor electrically excited to within specific ranges of plasma electron temperatures (10–20 eV) and electron densities ($10^{16}$ to $10^{21}$ cm$^{-3}$) which are required for optimally operating a lithium vapor discharge lamp at 13.5 nm. That same patent also proposed soft-x-ray lamps at wavelength of 7.6, 4.86, and 3.38 nm in beryllium, boron, and carbon plasmas. These wavelengths, however, are not within the range of wavelengths required for EUV lithography Although that patent described the general features of these lamps, it did not give the specific discharge current operating range that would minimize bore erosion and the emission of debris from the lithium lamp, or the appropriate range of bore sizes for operating such a lamp. That patent did not mention the use of other materials, such as atomic or molecular gases that could be successfully operated in the lamp configurations described in that patent; it naturally follows that neither could it have mentioned what are the preferred operating pressure ranges of those gases that would be suitable for EUV lithography.

SUMMARY OF THE INVENTION

Although gaseous plasma discharge sources have been produced previously in many different kinds of gases for use as light sources and as laser gain media, none have been demonstrated to have sufficient flux at appropriate EUV wavelengths for operating a commercial EUV lithography machine. Consequently the necessary plasma discharge current and gas pressure necessary to obtain the required flux for use in an EUV lithography system and/or related applications have not previously been identified and described. Likewise the required capillary discharge bore size range for EUV lithography, as well as some specific capillary discharge configurations for use with gases and metal vapors have not been previously identified. The subject invention specifically indicates the range of gas pressures the range of discharge currents and/or current densities under which debris ejected from the capillary is minimized, as well as some specific gases to be used under those conditions. Also described, are two specific discharge configurations one of which is designed specifically for gases or vapors and requires no vacuum window. We have termed this the "differentially pumped capillary discharge". The other is designed specifically for metal vapors or liquid vapors. We have termed this the "heat pipe capillary discharge." It contains a wick which is located only beyond the discharge capillary (unlike that described in U.S. Pat. No. 5,499,282 by William T. Silfvast issued on Mar. 12, 1996, in which the wick is located inside the capillary).

For purposes of definition of a capillary discharge, we are operating an electrical current within an open channel of an insulating material where the open channel is filled with a gas or vapor that allows for electrical conduction within the capillary. The channel or capillary is typically of cylindrical shape with a diameter in the range of 0.5 mm to 3 mm and a length varying from 0.5 mm to 10 mm. The ends of the capillary are attached to conducting materials to serve as electrical interfaces between the electrical current within the capillary and the electrical current of the external circuit. The capillary is filled with a gaseous medium that becomes ionized so as to provide a low resistance for conduction of the electrical discharge current within the capillary. The electrical discharge current excites the gas or vapor within the capillary which then provides the desired radiation in the spectral region between 11 nm and 14 nm. The gas or vapor within the capillary when ionized by the discharge current thus acts as both an electrically conducting medium and an EUV radiator.

The following objectives relate to capillary discharge sources operating in the wavelength range of 11–14 nm and which, within that wavelength region, provide the necessary flux for their particular applications. The objectives relate to: debris formation, materials considerations, discharge geometry, and applications.

The first objective of the present invention is to define the necessary capillary bore diameter and length ranges of a capillary discharge source. These dimensions are determined by experimental evidence in which strong EUV emission was observed.

The second objective of the present invention is to define the currents and current densities of operation of a capillary discharge source containing a gas or liquid vapor or metal vapor such that it will not produce debris destructive to the optics for a duration of at least the industry-defined lifetime of those optics.

The third objective of the present invention is to describe a method of pre-treating the capillary bore region so as to make it resistant to erosion or other changes in the capillary during subsequent normal operation.

The fourth objective of the present invention is to define the necessary operating pressure range of a gas or metal vapor or liquid vapor or other atomic or molecular species present within the capillary of a capillary discharge source.

The fifth objective of the present invention is to describe the "differentially pumped capillary geometry." This geometry obviates the need for an EUV transmitting window which would provide a barrier between the vacuum within the condenser system and the gas required for the source plasma emission.

The sixth objective of the present invention is to describe the "heat pipe capillary discharge" which contains a wick within a heat pipe configuration such that the wick is mounted only outside of the capillary discharge region.

The seventh objective of the present invention is to describe various materials which may be used in the "differentially pumped capillary discharge" and/or the "heat pipe capillary discharge."

The eighth objective of the present invention is to provide a capillary discharge source for use in any of the following applications: microscopy, interferometry, metrology, biological imaging, pathology, alignment, resist exposure testing for microlithography, and extreme ultraviolet lithography (EUVL).

A preferred method of operating a capillary discharge source in the 11 nm to 14 nm wavelength region includes forming a discharge within a capillary source having a bore size of approximately 1 mm, and at least one radiating gas, with a discharge current of approximately 2000 to approximately 10,000 amperes, and radiating selected wavelength regions between approximately 11 to approximately 14 nm from the discharge source.

The gases can include one radiating gas such as xenon or an oxygen containing molecule to provide oxygen as the one radiating gas, each having a pressure of approximately 0.1 to approximately 20 Torr.

The gas can include a metal vapor such as lithium, to radiate the selected wavelength regions and has a pressure of approximately 0.1 to approximately 20 Torr.

Besides the radiating gas, a buffer gas can be used, wherein the total pressure in the capillary can range from approximately 0.1 to approximately 50 Torr. The use of multiple plural gases can include lithium radiating the selected wavelength region between approximately 11 to approximately 14 nm, and helium as a buffer gas.

Another preferred method of operating a capillary discharge source in the 11 nm to 14 nm wavelength region includes forming a discharge across a capillary source having a bore size diameter of approximately 0.5 to approximately 3 mm, and a length of approximately 1 to approximately 10 mm, and at least one radiating gas, with a discharge current density of approximately 250,000 to approximately 1,300,000 Amperes/cm$^2$, and radiating selected wavelength regions between approximately 11 to approximately 14 nm from the discharge source.

A method of constructing the capillary discharge lamp source operating in the ultraviolet wavelength region includes constructing a capillary from an electrically insulating material, inserting at least one gaseous species in the capillary, wherein the capillary is used to generate ultraviolet discharges. A metallic conductor such as molybdenum, Kovar, and stainless steel, can be used as electrodes on opposite sides of the capillary. A nonconducting and the insulating material can be used such as quartz, saphire, aluminum nitride, silicon carbide, and alumina. Furthermore, the capillary can be a segmented bore of alternating conductive and nonconductive materials.

Another preferred embodiment of the discharge lamp source operating the ultraviolet wavelength region can include a capillary, a first electrode on one side of the capillary, a second electrode on a second side of the capillary opposite to the first side, a pipe having a first end for supporting the second electrode and a second end, a discharge port connected to the second end of the pipe, a wick passing through the pipe from the discharge port to a portion of the pipe adjacent to but not within the capillary having a lithium wetted mesh for operation as a heat pipe, and means for operating the capillary as a discharge source for generating ultraviolet wavelengths signals.

Pre-processing techinques of the capillary discharge bore source is when the bore is used with an optical element that operates in the ultraviolet region, prior to operating the source, in order to prevent rupturing of the optical element or contaminating mirrors that receive radiation, are disclosed. The pre-processing techniques include the steps of pre-conditioning interior bore surface walls of a capillary discharge source that operates in the ultraviolet region, and continuing the pre-conditioning until a selected impulse value is reached.

The pre-processing technique can use a heat source, such as an excimer laser, a Nd:Yag laser, and a Copper Vapor laser. The laser can be focussed within the bore, and operated at a focussed intensity in the range of approximately $10^7$ to approximately $10^{11}$ Watts/cm$^2$.

Another version of the pre-processing technique has the selected value less than approximately 20 Torr-$\mu$s, wherein initiating discharge current discharge pulses within the capillary with a second gas having a pressure range of approximately 1 to approximately 20 Torr., and the pre-operation pulses are approximately 3000 pulses.

Further objects and advantages of this invention will be apparent from the following detailed description of a presently preferred embodiment which is illustrated schematically in the accompanying drawings.

BRIEF DESCRIPTION OF THE FIGURES

FIG. 3B shows a differentially pumped capillary configuration of the novel invention for gases.

FIG. 4 shows a spectrum of xenon in the 1 nm to 14 nm spectral region produced in a 6 mm long 1 mm bore size capillary discharge at various gas pressures at a discharge current of 6,000 Amperes when operated within the differentially pumped capillary configuration of FIG. 4B indicating an optimum pressure at the high pressure end of the capillary between 0.5 and 1 Torr and showing the emission reduces to a non useful level at a pressure of 0.15 Torr. This information suggests that a pressure range of 0.1–20 Torr is the range of suitable operation of a capillary discharge. The upper limit is determined from knowledge of plasma generation at higher pressures for which plasma arcs typically form, substantially inhibiting proper plasma formation.

DESCRIPTION OF THE PREFERRED EMBODIMENT

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

OPERATING CONDITIONS FOR A PULSED CAPILLARY DISCHARGE LAMP FOR EXTREME ULTRAVIOLET LITHOGRAPHY (EUVL) AND OTHER APPLICATIONS SUCH AS RESIST EXPOSURE TOOLS, MICROSCOPY, INTERFEROMETRY, METROLOGY, BIOLOGY AND PATHOLOGY

The pulsed capillary discharge lamp sources that can be used with these operating conditions can be those described in U.S. Pat. No. 5,499,282 to Silfvast; and parent U.S. application Ser. No. 08/815,283 to Silfvast et al., which are both assigned to the same assignee as the subject invention and which are both incorporated by reference For purposes of clarification: the gaseous species excited within the capillary can be any of the following: 1. a pure, 100%, concentration of an atomic or molecular gas (which may also include vaporized atomic and/or molecular materials) in either their neutral or ionized stats: acting as the radiating species; 2. a buffered gas mixture of an atomic or molecular gas or vapor in either its neutral form or ionized form with a second atomic or molecular gas wherein the first gas or vapor serves as the radiating species and the second gas serves as the buffering species. The buffered gas interacts with the discharge, thereby promoting effective operation which might include but is not restricted to any of the following processes: generation of appropriate plasma conditions (such as temperature and density), mechanism for either cooling the electrons and/or for cooling the system, and for, in the case of a vapor emitter, preventing vapor diffusion throughout the system such that the lamp operates in either heat pipe mode or as a pure metal vapor cell.

An example of a metal vapor radiator useful in the subject invention is a lithium metal vapor operating at one or both of the following wavelengths: 11.4 nm and 13.5 nm.

Figure 5:
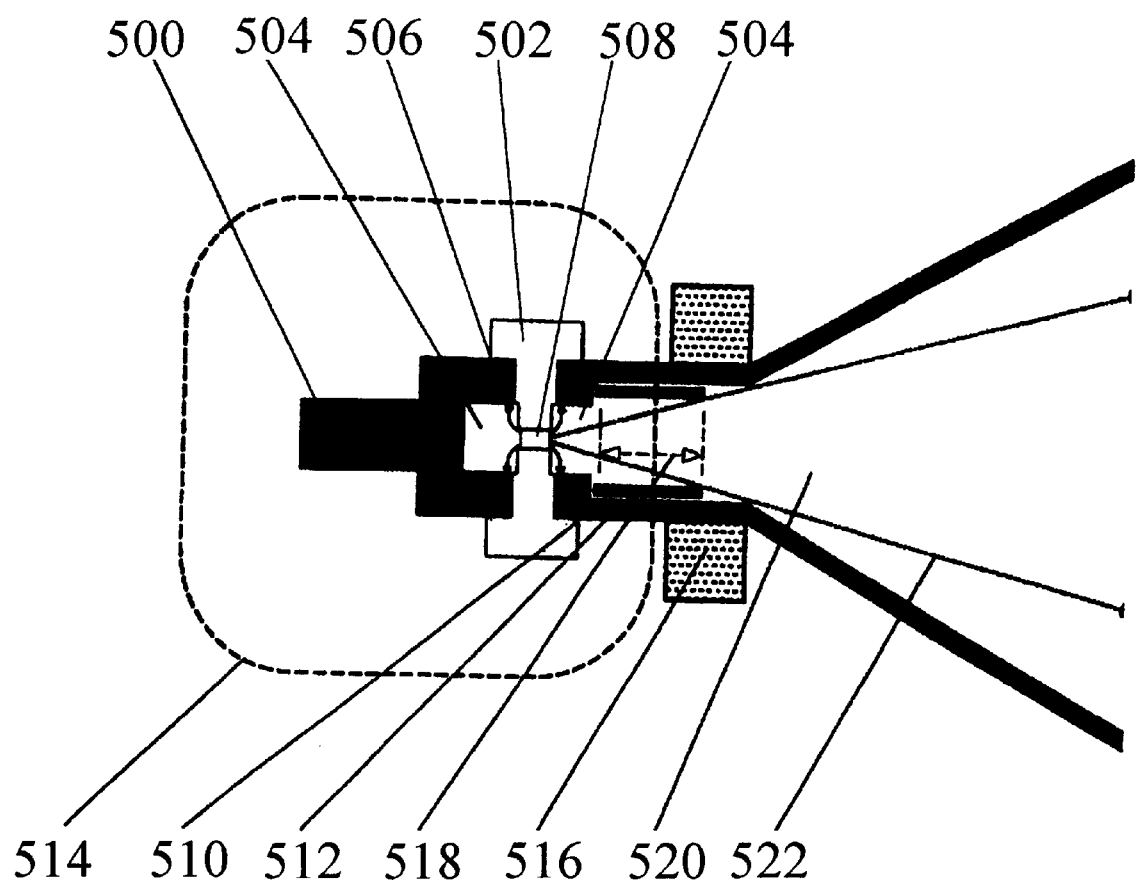
FIG. 5 shows a capillary discharge configuration of the novel invention for producing strong emission in the 11 nm to 14 nm spectral region for EUVL and related applications in metal vapors that consists of a heat pipe operation at one end of the capillary in which the heat pipe wick is located only in the region outside of the capillary discharge region. In using this configuration, rather than a configuration in which the wick is within the capillary (as described in U.S. Pat. No. 5,499,282) a significant improvement is incorporated into the design: the electrical discharge current might flow through the capillary only by ionizing and electrically exciting the metal vapor within the capillary. In contrast, using the previous design current could have been electrically conducted through the capillary by the wick itself, rather than by the vapors within the discharge bore. However, even though the wick is not located within the capillary, it will still serve to continually replenish the metal vapor pressure in the capillary discharge region over the operating lifetime of the capillary discharge source.

An example of a buffered metal vapor lamp useful in the subject invention is a lithium metal vapor heat pipe as indicated in FIG. 5, buffered by helium or other gas and operating at one or both of the following wavelengths: 11.4 nm and 13.5 nm.

Figure 2A:
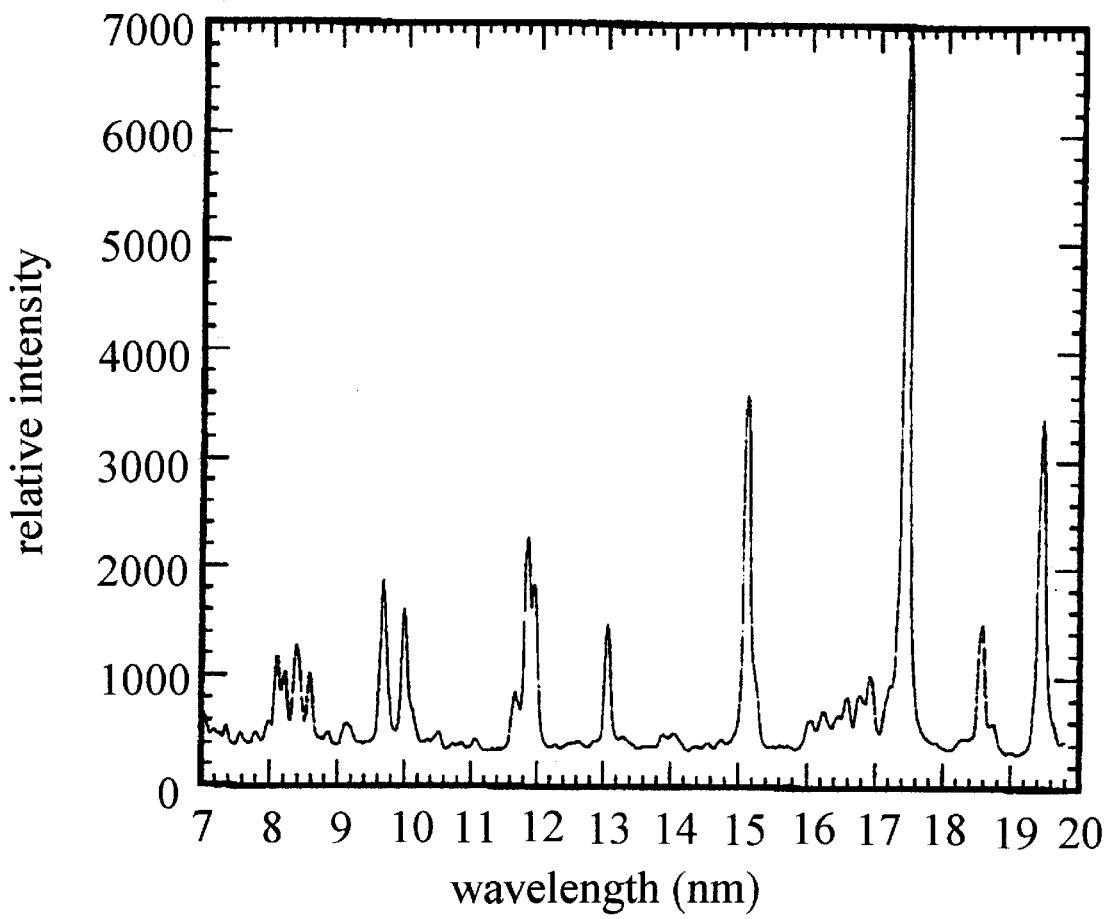
FIG. 2A shows a spectrum of oxygen in the 11 nm to 14 nm spectral region produced in a 6 mm long 1 mm bore size capillary discharge.
Figure 2B:
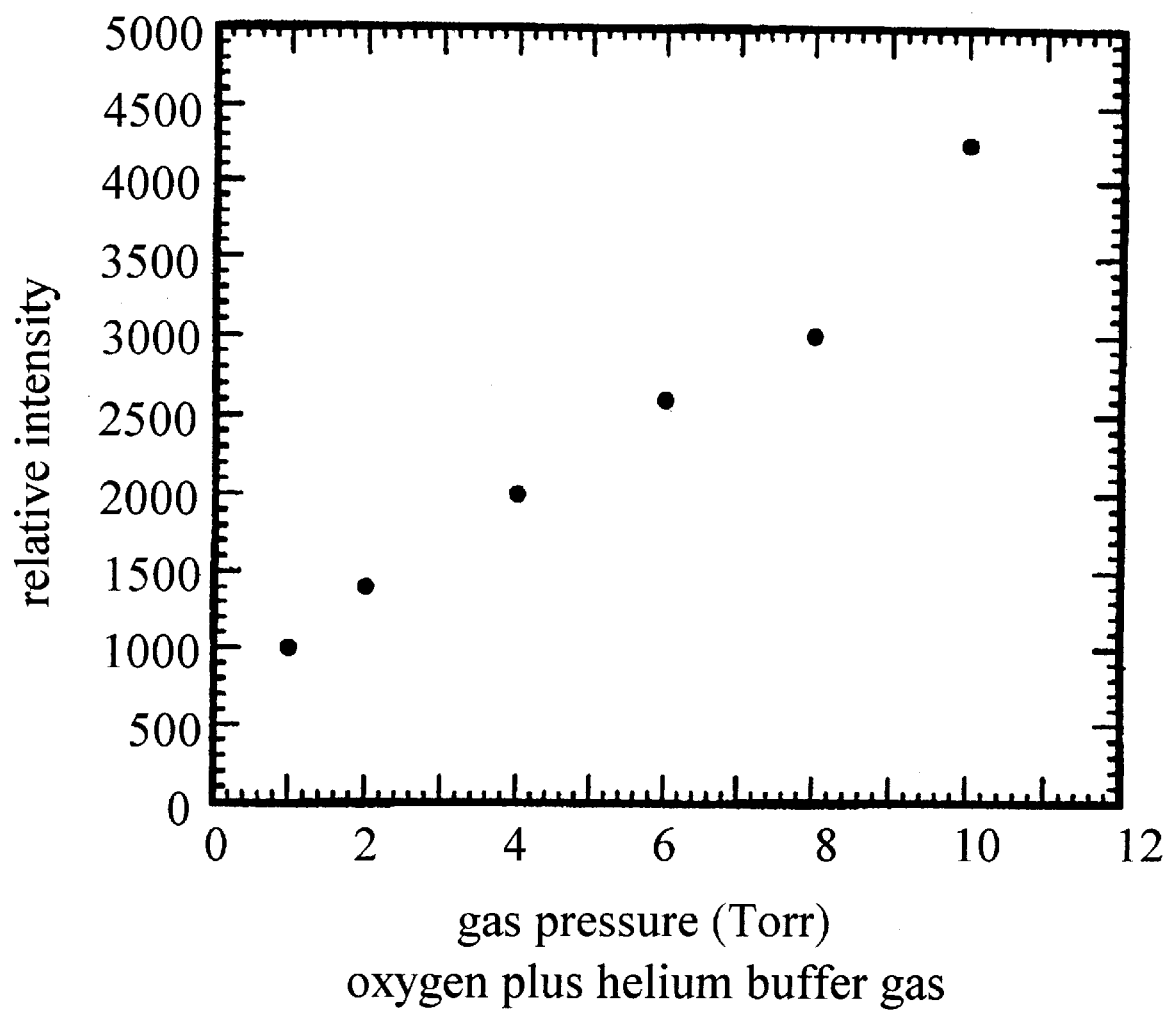
FIG. 2B shows the emission intensity of oxygen at 13 nm at various gas pressures at a discharge current of 6,000 Amperes when operated within the constant pressure capillary discharge configuration shown in FIG. 3A. It indicates that the emission at 13.5 nm and 11.4 nm continues to increase with pressures up to 10 Torr.

An example of a discharge source useful in the subject invention using a pure atomic or molecular gas is an oxygen lamp which contains a 100% concentration of oxygen operating on one or more of the following wavelengths in five times ionized oxygen: 17.3 nm, 15.0 nm, 13.0 nm, and 11.6 nm, as shown in FIGS. 2A and 2B.

An example of a buffered gas mixture in a lamp useful in the subject invention is a first atomic or molecular gas with a second atomic or molecular gas is in a lamp which consists of oxygen as the radiating species, (operating on one or more of the following oxygen lines: 17.3 nm, 15.0 nm, 13.0 nm, and 11.6 nm.) buffered by any second gas such as one of the noble gases(helium, neon, argon, krypton, and xenon).

Figure 1:
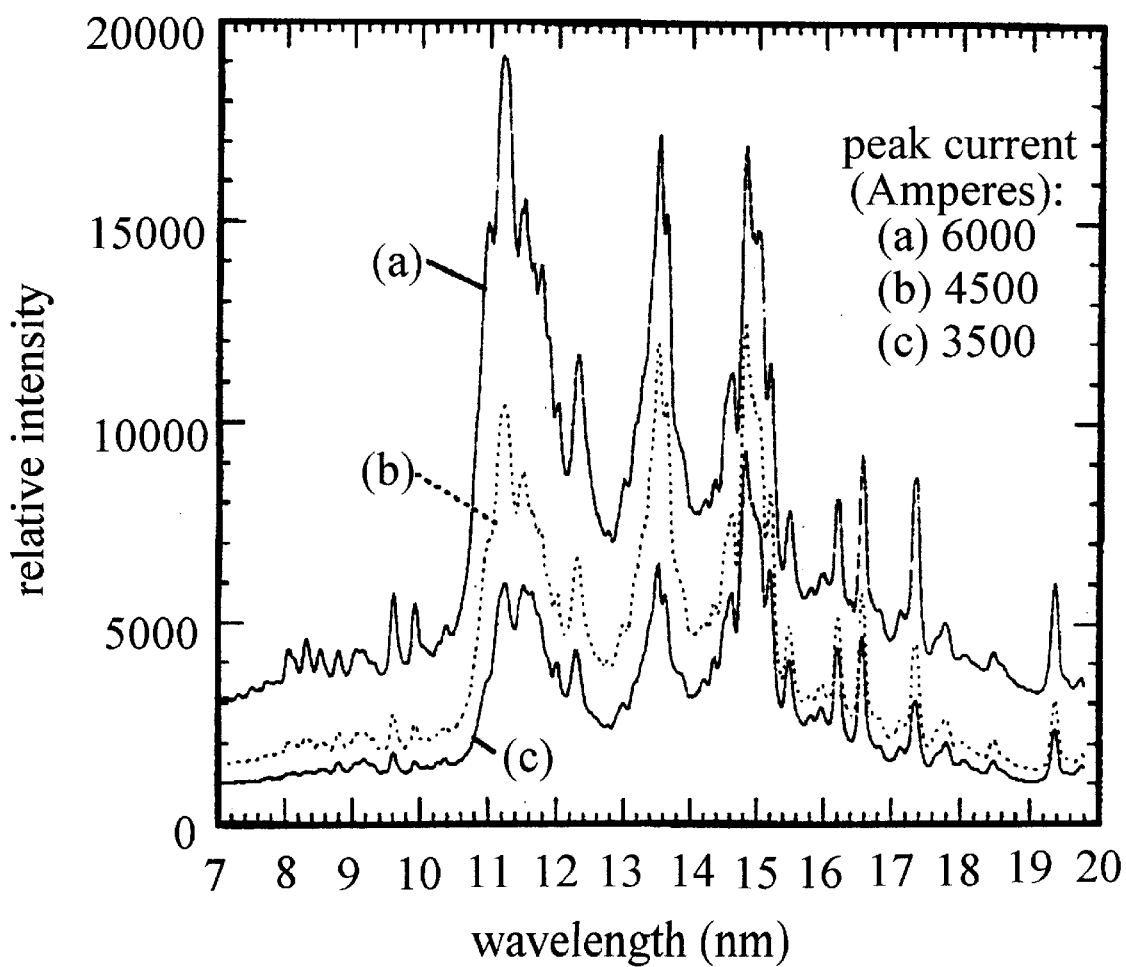
FIG. 1 shows a spectrum of xenon in the 11 nm to 14 nm spectral region produced in a 6 mm long 1 mm bore size capillary discharge at various discharge currents. It can be seen that at discharge currents below 3,500 Amperes or 450,000 Amperes/cm$^2$ the emission at 13.5 nm and at 11.4 nm (the two wavelengths of particular usefulness) decreases to a value that is significantly below peak measured emission at higher currents. To allow for the possibility of other gaseous or metal vapor species being more efficient than xenon in radiating, we have thus defined a minimum current at which significant emission is produced in relation to a minimum discharge current within a 1 mm bore size capillary at 2,000 Amperes or a minimum discharge current density when extrapolating to other capillary bore sizes of approximately 250,000 Amperes/cm$^2$.

The subject inventors observed intense oxygen emissions at approximately 17.3, 15.0, 13.0 and 11.6 nm, wherein the peak intensity per unit wavelength of oxygen at 13.0 nm is greater than that of a tin laser produced plasma at its peak intensity per unit wavelength. The peak emission at 17.3 nm has been observed to be three times higher than at 13.0 nm. Experimental evidence we obtained in a 1 mm bore capillary discharge as shown in FIGS. 2A and 2B for oxygen, and FIGS. 1 and 4 for xenon, suggests that gaseous radiators existing in partial pressures from approximately tens of millitorr up to approximately 20 Torr can intensely emit in the EUV. The range of currents and the range of pressures for operation will now be described.

(1) Current Ranges for operation

A lamp with a 1mm capillary using any radiating species would operate within the following current ranges, whereby the minimum current represents the smallest current at which the required flux for the selected application is obtained, and the maximum current is determined by the current at which significant bore erosion begins to occur. For aluminum nitride capillaries this is anywhere between approximately 2000 to approximately 5500 Amperes; for silicon carbide capillaries between approximately 2000 to approximately 10,000 Amperes. Larger or smaller capillary bore sizes can be used consistent with the above current densities; for aluminum nitride capillaries: approximately 250,000 to approximately 700,000 Amperes per square centimeter; for silicon carbide capillaries: approximately 250,000 to approximately 1,300,000 Amperes per square centimeter. Other ceramic capillary materials can be operated in a range of currents from a minimum current density of approximately 250,000 Amperes/cm$^2$ and a maximum current density which is determined by that current density at which significant bore erosion occurs (as determined by debris tests indicating reduced emission from the lamp after approximately 10$^8$ to approximately to approximately 10$^9$ pulses or window damage).

(2) Range of Pressures for Operation

For a capillary discharge lamp the radiating species can exist in a partial pressure range anywhere from approximately 0.025 to approximately 20 Torr, and a total pressure (radiator plus buffer partial pressure) no greater than approximately 50 Torr.

TECHNIQUES AND PROCESSES TO MITIGATE AGAINST CAPILLARY BORE EROSION, PRESSURE PULSE GENERATION, AND DEBRIS FORMATION IN CAPILLARY DISCHARGE-POWERED LAMPS OPERATING IN THE EXTREME ULTRAVIOLET (EUV)

The capillary discharge lamp sources that can be used with these techniques and processes can be those described in U.S. Pat. No. 5,499,282 to Silfvast; and parent U.S. application Ser. No. 08/815,283 to Silfvast et al., which are both assigned to the same assignee as the subject invention and which are both incorporated by reference (A) Operational Ranges Erosion in ceramic capillary bores is substantially reduced if the operational current and current density are held to certain limits, and will be described in reference to FIG. 6. The range of operational currents in 1 mm capillary discharges is the following: for aluminum nitride capillaries, peak currents between approximately 2000 Amperes and approximately 5500 Amperes, and for silicon carbide capillaries, peak currents between approximately 2000 Amperes and approximately 10000 Amperes. The range of current densities for discharges in any size capillary is the following: for aluminum nitride capillaries, peak current densities between approximately 250,000 Amperes per square centimeter and approximately 700,000 Amperes per square centimeter, and for silicon carbide capillaries, peak current densities between approximately 250,000 Amperes per square centimeter and approximately 1,300,000 Amperes per square centimeter.

(B) Preprocessing of the Insulator

Figure 7:
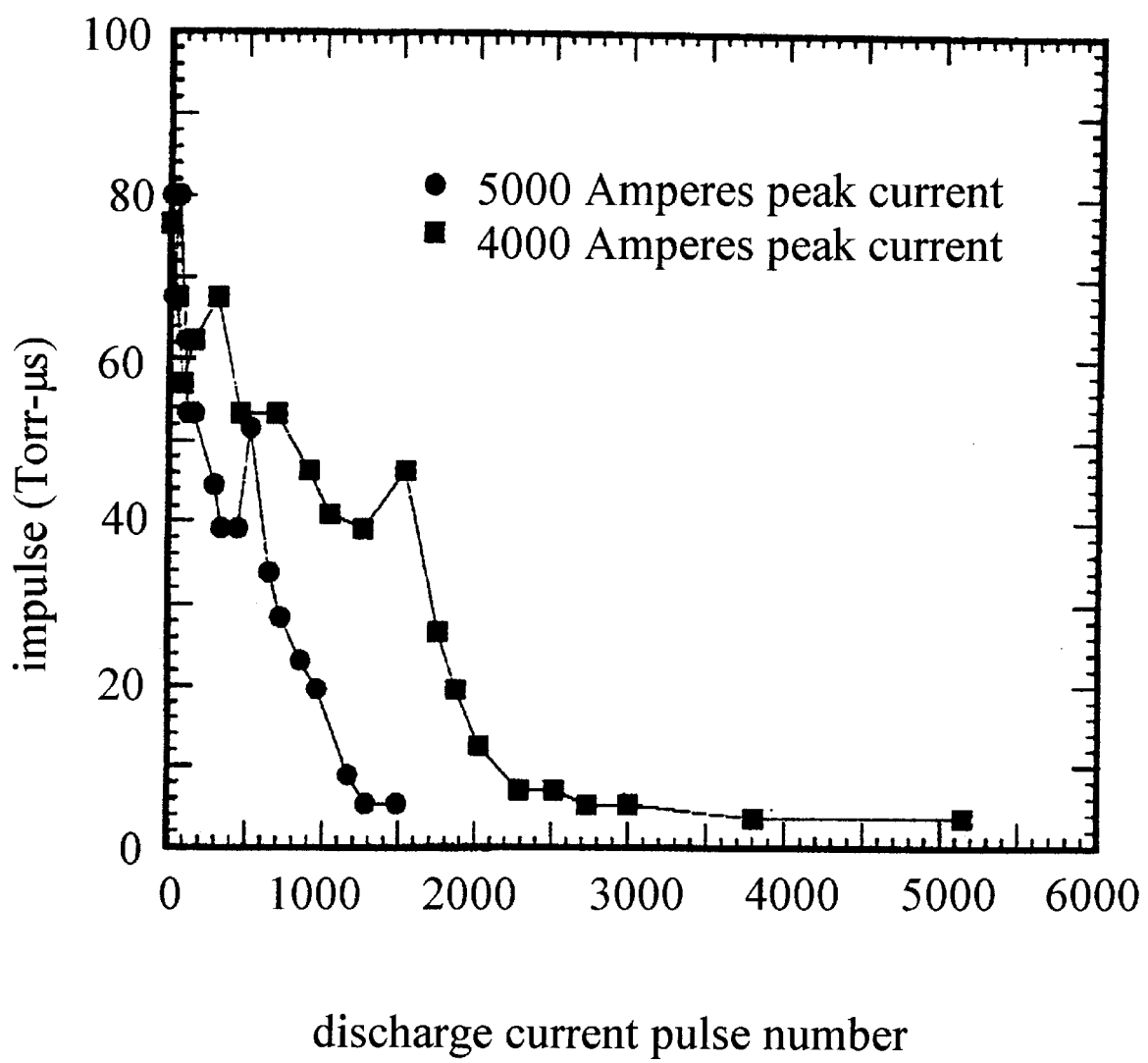
FIG. 7 shows a graph of the reduction in the impulse produced on the axis of the capillary at a distance of approximately 10 cm beyond the end of the capillary as the number of pulses of discharge current are initiated within the capillary as the number of discharge current pulses are increased within the capillary. It is desirable to have this impulse minimized to prevent rupturing of a window or other optical element. This can be obtained either by subjecting the bore to a number of pre-operation pulses (3000 for the conditions shown in FIG. 8) or by heat treating the capillary bore surface with a laser or other means of heat treatment so as not to have a disruptive pressure pulse during operation that could possibly damage a window or other useful element that is located beyond the capillary region but in the path of the emitted radiation emerging from the capillary.

Material emissions from discharges in ceramic capillary bores is not constant over the life of the capillary and can be substantially decreased if, before the capillary is incorporated into a final lamp assembly, it is seasoned by exposure to a number of discharge current pulses, and will be described in reference to FIG. 7. From these figures, and analysis, the pre-treatment of capillary bores by passing discharge current pulses in the operational ranges described above is necessary to reduce discharge material emissions. Between approximately 1 and approximately 10,000 discharge pulses (for example 3,000 pulses using conditions in paragraph (1) for Characteristics common to all discharges . . . as described below, are required, and pulses above approximately 10,000 are not relevant to the process of emission mitigation.

Figure 8:
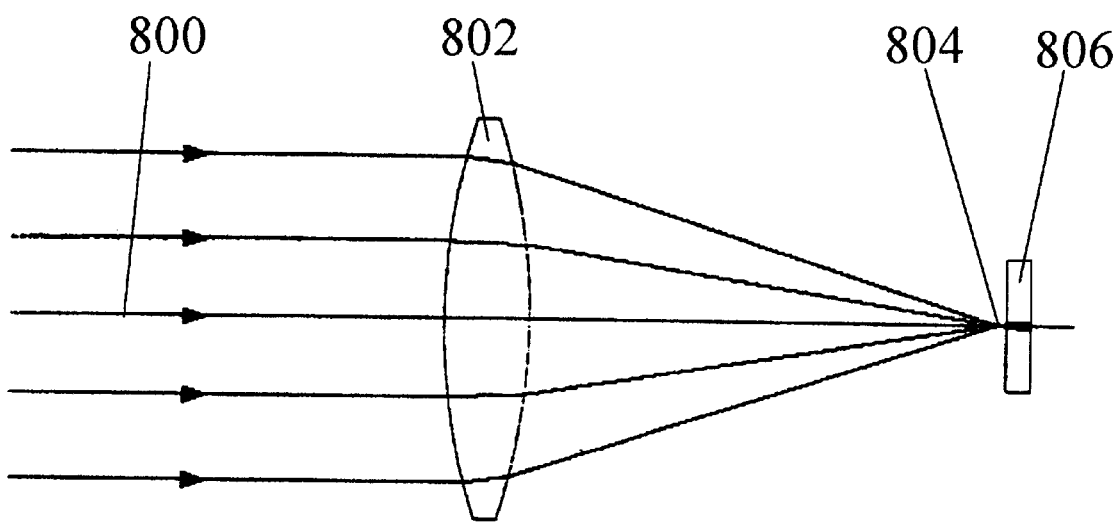
FIG. 8 shows an over view of laser heat treatment of the novel capillary bore invention.

Pretreatment by discharge or other heat-treatment affects structural morphology of the ceramic bore. The morphological changes in the capillary bore wall are the essential causal factors resulting in material emissions decrease, and that means other than discharges can bring about the salutary changes. These other means can include, but are not limited to, laser drilling and laser heat treatment as shown in FIG. 8.

(1) Characteristics Common to All Discharges in this investigation of Bore Erosion.

Capacitor bank with a total capacitance of 0.18 $\mu F$ (microfarads) is charged to voltage and discharged across a 1 millimeter nominal diameter by 6.35 mm long capillary in ceramic, either aluminum nitride (AlN) or silicon carbide (SiC). At 5 kV discharge voltage, the total stored energy is 2.25 J. so 1–2 Joules per shot is typical across the capillary. Repetition rate is variable up to a present maximum of 60 Hz. The current-versus-time curve looks like a damped sinusoid with 460 ns full width for the first half cycle. The second half cycle peak is about –0.5 times the first half cycle peak. All discharge processing pulses were made with 10 Torr argon gas fill.

(2) Bore erosion data

Beginning with a virgin capillary, we fired 1000 shots at a given peak current. We microscopically analyzed the capillary bore before and after each set of shots. Microanalysis measures average bore diameter at the capillary face and also at a point slightly (estimated approximately 0.25 mm) inside the bore from the face, this for both the high-voltage-facing side and the ground-facing side of the capillary. Hence four diameter measurements are made at each peak current, which are expressed as ablated mass amounts by assuming uniform wear down the entire length of the capillary (this is not always true). In some cases the bore begins to close up at one end; this is expressed as negative ablated mass amounts.

Figure 6:
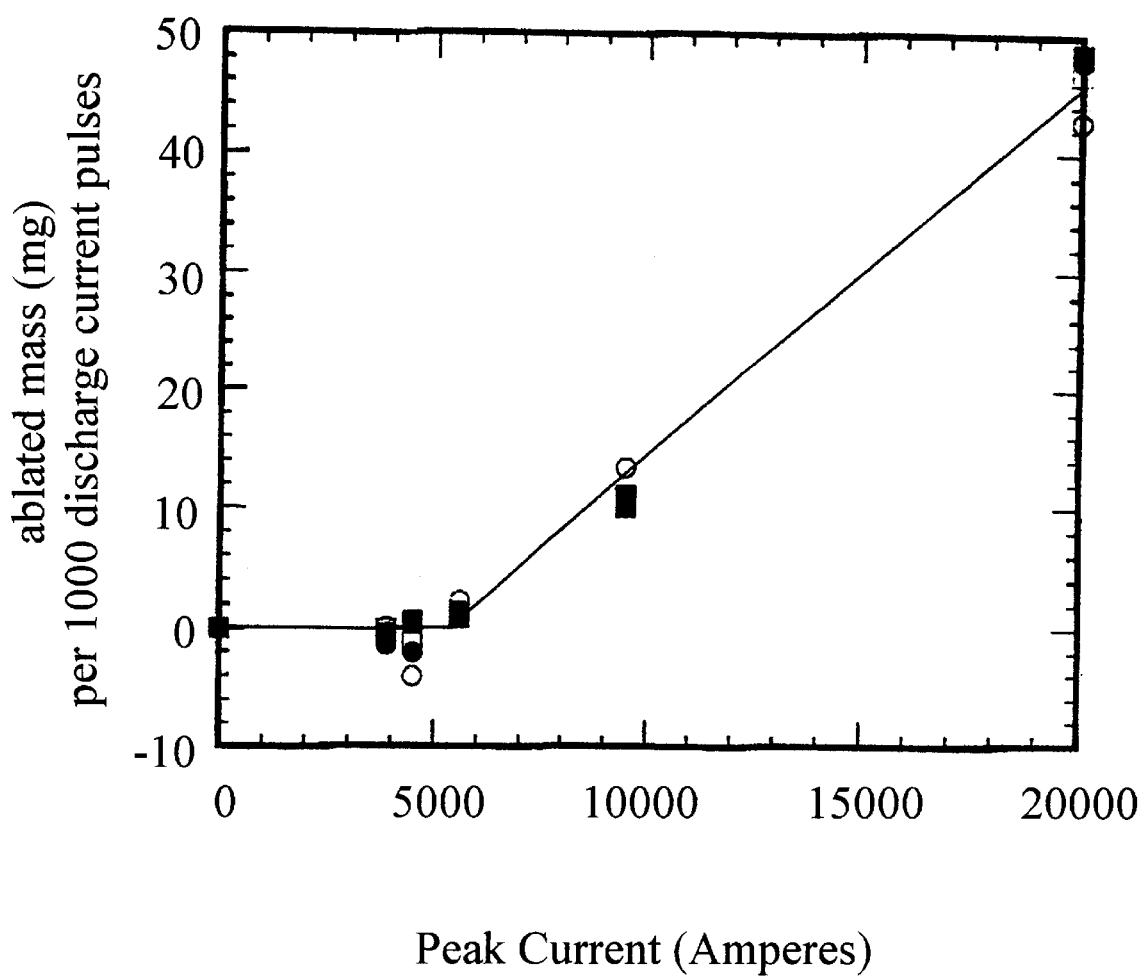
FIG. 6 shows a graph of the relative amount of debris generation (ablated mass from the capillary bore region) as the discharge current is increased within the capillary in a 1 mm bore by 6 mm long capillary. This graph suggests that in this situation for an aluminum nitride capillary material, the current should be kept below 5500 Amperes. This represents a discharge current density of 637,000 Amperes/cm$^2$. There can be other possible bore materials that have higher erosion resistance so we have set an upper limit on the current density (to allow for other capillary bore sizes of 1,300,000 Amperes/cm$^2$.

Referring to the graph in FIG. 6, fifty milligrams ablated mass corresponds to a 33% diameter increase, or a 76% increase in bore cross-sectional area. Below approximately 5 kA, aluminum nitride capillaries show very little erosion. Extended discharge runs show bore erosion at the 0 to 6% level after 100,000 shots at 4 kA. Silicon carbide capillaries do not exhibit erosion out to 10 kA peak current (1.27 $MA/cm^2$).

FIG. 6 shows the stability of SiC capillaries even at the high peak current of 7500 A. Some very slight filling in of the ground side bore aperture is evident in these data at 10,000 shots.

(3) Pressure pulse data

Starting with virgin capillaries, we measured the pressure impulse (time-integrated overpressure) generated by the discharge by measuring mechanical impulse delivered to a moveable detector. While we have no data on the temporal form of the pressure wave from these measurements, an assumption is typically made that its extent is roughly that of the current, i.e. about half to one microsecond. Data from AlN capillaries (FIG. 7) show that an almost two order of magnitude decrease in impulse occurs over the first few thousand discharges. We call this the "break-in" or "seasoning" curve. Systematics suggest this is caused by vaporization of more volatile components in the capillary bore inner wall. Morphology changes are seen microscopically.

Early results with ultra-thin windows provided by Sandia National Labs placed approximately 10 cm from the discharge show survivability from 3.5 kA discharge pressure pulses, but failure when the current was raised to 4 kA. However, this data as taken with unseasoned capillaries (around 1600 shots at less than 3 kA before the window test was tried). So that more extensive testing with seasoned capillaries can still be done.

(4) Witness plate debris data

Plastic debris-collecting slides (22 mm square, approximately 160 mg each) were placed at approximately 5 and 10 cm from the discharge, with the top edge of the 5 cm plate slightly below the bore centerline and the 10 cm plate square to the bore centerline, hence partially shadowed by the 5 cm plate top edge. Weights before and after shot runs were recorded, using a scale with 100 microgram resolution and approximate 200 microgram reproducibility. Fogging observed was patterned, not uniform as would be expected for vapor diffusing. A clear shadow of the top of the 5 cm plate is seen on the 10 cm plates for all fogged sets. The as-laid transparent film which fogs after sitting on the shelf suggests oxidation of a very thin, perhaps metal, coating. No evidence of particulate deposition was seen in the fogged material when viewed microscopically, down to the resolution limit of the optical microscope (estimated at 0.5 micrometers). Atomic Force Microscope imaging can be done for future testing.

ADDITIONAL MATERIALS FOR CONSTRUCTION OF CAPILLARY DISCHARGE DEVICES FOR EUVL AND RELATED APPLICATIONS

Any of the previous materials combinations claimed for a lithium discharge lamp can also be used in operating lamps that use other gaseous media as described above, as well as those described in U.S. Pat. No. 5,499,282 to Silfvast; and parent U.S. application Ser. No. 08/815,283 to Silfvast et al., which are both assigned to the same assignee as the subject invention and which are both incorporated by reference. These materials can be based on the following: any combination of metallic, electrically conducting electrodes and ceramic or insulating capillaries wherein the thermal expansions of the metallic and ceramic materials are closely matched to ensure the mechanical robustness of the lamp at its operating temperature, and such that the materials are resistant to damage or corrosion by the emitting gaseous species and the buffering gaseous species (if present). These include but are not limited to molybdenum as the metallic conductor and either aluminum nitride, alumina or silicon carbide as the ceramic insulator (as described in U.S. Pat. No. 5,499,282 to Silfvast; and parent U.S. application Ser. No. 08/815,283 to Silfvast et al. for use with lithium). For an oxygen emitter/helium buffered system, the above mentioned materials combination can be used, but more conventional and economic material combinations can be used including but not limited to Kovar metallic conductor and an alumina ceramic insulator.

CAPILLARY CONFIGURATIONS WITH UNIFORM DISCHARGE AND DIFFERENTIALLY PUMPED DISCHARGE

Figure 3A:
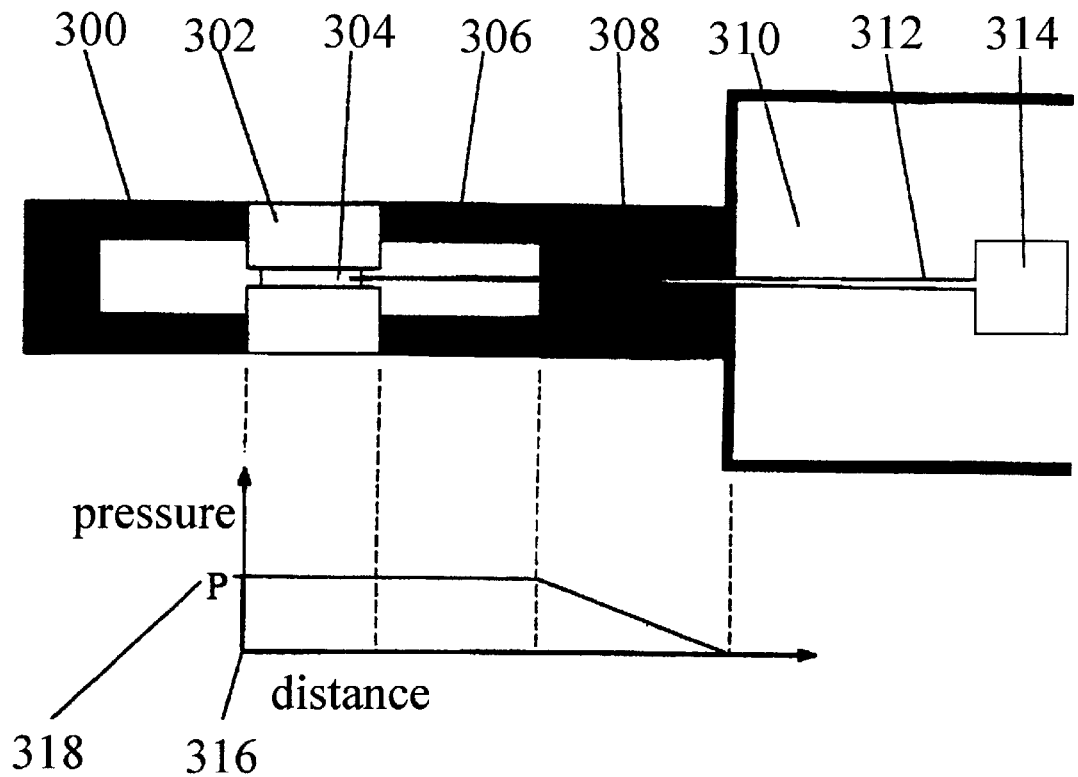
FIG. 3A shows a uniform discharge capillary configuration of the novel invention for gases.

FIGS. 3A and 3B show two assemblies that utilize the capillary discharge EUV source. FIG. 3A shows an arrangement which maintains a uniform constant gas pressure along the length of the capillary discharge. FIG. 3B shows a configuration which utilizes the capillary bore itself as a solid-angle limiting aperture, giving a wide divergence of emitted EUV radiation at the expense of creating a gas pressure gradient across the length of the capillary.

FIG. 3A shows an arrangement for producing and detecting EUV radiation using a capillary discharge source. Electrode 300 is charged to high voltage; as well, gas is fed to the cavity region contained by this electrode. This gas will contain the EUV radiating species, and in the simplest case, will be the radiating gas itself, such as but not limited to xenon gas. A discharge 304 is initiated between electrodes 300 and 306 which flows through and is contained by the capillary bore in the insulator 302. The electrode 306 can be a separate conductor within the assembly which completes the circuit, or it can simply be the grounded body of the lamp housing as shown. A differential pumping port 308 is a plug of solid material with a long narrow bore hole, such as but not limited to 1" thick stainless steel with a 1 mm diameter hole drilled there-through. The differential pumping port interfaces to a region 310 of high vacuum (less than approximately 0.01 Torr). The impedance to gas flow caused by the long narrow hole allows the maintenance of a substantial gas pressure gradient across the differential pumping port. As a result, the gas pressure along the capillary discharge 304 is kept very nearly constant while the EUV can be propagated 312, and detected and analyzed by a spectrograph detector 314, under a vacuum condition. The gas pressure profile versus position in this assembly is plotted in 316. The base pressure P at the discharge 318, can be maintained anywhere in a useful range from approximately 0.1 to approximately 10 Torr by adjusting the gas feed rate to the electrode 300.

FIG. 3B shows as less constrained sources assembly. Electrode 350 can be fed with gas and charged to high voltage, and a discharge 354 to ground electrode 356 is contained by a capillary bore in insulator 352, all as was the case in FIG. 3A for 300, 304, 306 and 302, respectively. In this assembly, however, the capillary bore itself is used as the differential pumping port and the capillary directly interfaces the high vacuum region 358. The EUV emission 360 propagates in a much wider sold angle as shown. As a consequence, the gas pressure profile 362 shows a gradient along the capillary bore. Base pressure P, 364 is here in the range of approximately 0.1 to approximately 50 Torr.

FIG. 3B shows the novel lamp configuration referred to as "differentially pumped capillary geometry" which allows a lamp that uses gases (as opposed to a lamp that operates with metal vapors) to operate without a window between the gaseous region and the optics that collects the radiation emitted from the lamp in the 11 nm to 14 nm wavelength region. Because of the very strong absorption of radiation in that wavelength region by all materials, including gasses, it is necessary in an EUV lithography system, as well as other applications, to operate the imaging system within a very low pressure environment having a pressure of less than approximately 0.01 Torr. Hence, a lamp would generally need a window to separate the region of the lamp operating in the 0.1 to 50 Torr. pressure region from the low pressure region (less than approximately 0.01 Torr) of the imaging system. Our differentially pumped capillary geometry allows for the operation of the lamp containing the radiating gas without the need of such as window. In the operation of this lamp, the gas is inserted at the opposite end of the discharge capillary from that where the radiation flux in the 11 nm to 14 nm radiation is collected. The pressure at that end of the capillary would be in the range of from approximately 0.1 to approximately 50 Torr. depending upon the particular gas and the desired emission characteristics of the lamp. The gas is pumped through the capillary by having a vacuum pump accessible to the opposite end of the capillary, the end where the radiation flux between 11 nm and 14 nm is collected and used in the desired optical system such as EUV lithography. As the gas is pumped through the discharge capillary the pressure drops approximately linearly such that it is at the necessary low pressure(less than approximately 0.01 Torr.) when it emerges from the capillary. The lamp is operated just like other lamps that have a constant pressure over the length of the capillary bore region by initiating a pulsed discharge current within the capillary. We have observed that there is sufficient pressure within the capillary, even at the low pressure side, to produce the desired emission form the lamp and yet the region beyond the lamp has sufficiently low pressure to allow for transmission of the radiation between 11 nm and 14 nm. The capillary itself acts as a retarding system for the gas as it flows through the capillary so that the usage of gas is at a very low rate. The gas can also be recycled back to the high pressure side for reuse.

LAMP CONFIGURATION STRUCTURES FOR LAMPS USING GASES AND FOR USING METAL VAPORS AS THE RADIATING SPECIES

FIG. 5 shows a novel lamp configuration that can operate in the heat pipe mode having a wick on the front (window) side of the lamp. FIG. 5 shows a metal vapor heat pipe type lamp assembly suitable for generating EUV radiation from lithium vapor. The electrode 500 is charged to high voltage and contains in its cavity some pressure of lithium vapor 504 and a source of lithium such as a few grams of lithium metal or liquid lithium. A discharge 506 is generated between this electrode and an electrode completing the circuit, which can most simply be the grounded body of the lamp housing 510. The discharge is contained in the capillary bore 508 of the insulator 502. The plasma 508 will be ionized lithium and will radiate 522 useful narrow line emissions in the EUV. To maintain the lithium vapor pressure requires the use of a heater 514, heat sink 516, wick 512, and buffer gas 520. This is the principle of the heat pipe. Heater 514 can be a commercial high temperature resistive oven such as but not limited to a Lindberg model 50002. Heater 514 maintains an equilibrium vapor pressure between the lithium source in electrode 500 and the lithium vapor 504. Lithium vapor flowing out toward the cooler region of the assembly condenses as liquid lithium on the wick 512. Wick 512 can be a stainless steel woven wire mesh fabric with approximately 30 lines per inch or finer, which is rolled into a hollow cylinder shape and placed in contact with the inside tube walls of the heat pipe body 510. A temperature gradient across the wick is maintained by a cooling collar such as but not limited to a a few (approximately 2 to 7) turns of refrigerated fluid(such as but not limited to chilled water) flowing through a coil of copper tubing and conductively contacting the heat pipe body 510 as shown. The temperature gradient thus created along the wick causes liquid lithium which has condensed on the wick to flow back toward the hotter region, to maintain the lithium vapor pressure on the EUV output side of the capillary. A buffer gas 520, such as but not limited to helium, is necessary for the operation of the heat pipe. In unheated regions, the system-wide gas pressure equilibrium is maintained by this buffer gas. In the vicinity of the wick 512, there is a transition region 518, where there are partial pressures of both lithium vapor and buffer gas. In this region, nearer the capillary, the lithium vapor dominates, and as the temperature decreases in going outward, the partial pressure of the buffer gas progressively increases. Pressures balance so that throughout the entire lamp assembly, the total pressure (sum of lithium vapor pressure and buffer gas pressure is a constant.

The region adjacent to the capillary must be maintained at a temperature equivalent to the temperature necessary to generate the desired lithium vapor density within the capillary. This will establish a lithium metal vapor in that region of the pipe. This vapor will diffuse into the capillary and rear electrode region, and will not condense there as long as these regions are maintained at a higher temperature. Thus within the capillary region is established a lithium metal vapor pressure equivalent to the saturated vapor pressure of the wick region adjacent to the capillary. A discharge is struck between the two electrodes 10, 30 such that the current passes through the ceramic capillary, exciting the lithium vapor, and generating soft x-rays. A buffer gas establishes a transition region in the pipe, on the window side, beyond which lithium vapor diffusion is sharply reduced.

The heatpipe mode of FIG. 5 differ from that shown in FIG. 4 of the lithium heat pipe of U.S. Pat. No. 5,499,282 primarily in the placement of the wick. In that description, the wick is shown placed within the capillary itself and extending into the rear electrode region, opposite the window. In contrast the modified lithium heat pipe of subject invention FIG. 6 has a mesh wick 40 only on the front (window) side 90 of the lamp 1, extending up to, but not beyond the capillary 20, creating a more favorable environment for conduction through the lithium vapor within the capillary 20.

The minimum capillary bore diameter will be pressure sensitive and of such a dimension so as to insure that sufficient collisions of electrons with ions occur to produce excitation of radiating states before the electrons collide with the capillary wall and are consequently de-energized. It will also be determined by the size below if it is difficult to initiate a pulsed discharge current within the capillary. Such a minimum diameter is of the order of approximately 0.5 mm. The maximum bore diameter is determined by the desire to keep the radiating flux to a minimal size so as to make it more readily adaptable to a condenser system for imaging purposes and also to keep the total current to a reasonable size and yet still provide the optimum current density desired. A reasonable maximum size would be on the order of approximately 3 mm. The minimum length of the bore should be no smaller that the capillary bore diameter. The maximum bore length should be sufficiently long to produce enough radiative flux for the selected application but not overly long so as to waste input energy to produce radiation that cannot be used because of being too far removed from the output end of the capillary. From geometrical considerations associated with radiating output flux, the bore length should be no longer than approximately ten bore diameters. Pass the 10 diameter bore length would restrict the radiation flux.

PRE-PROCESSING THE CAPILLARY BORE TO MITIGATE AGAINST BORE EROSION

Techniques for pre-processing the inner bore walls will now be described in reference to both FIGS. 7 and 8. FIG. 7 shows a graph of the reduction in the impulse produced on the axis of the capillary at a distance of approximately 10 cm beyond the end of the capillary as the number of pulses of discharge current are initiated within the capillary as the number of discharge current pulses are increased within the capillary. It is desirable to have this impulse minimized to prevent rupturing of a window or other optical element. This can be obtained either by subjecting the bore to a number of pre-operation pulses (3000 for the conditions shown in FIG. 8) or by heat treating the capillary bore surface with a laser or other means of heat treatment so as not to have a disruptive pressure pulse during operation that could possibly damage a window or other useful element that is located beyond the capillary region but in the path of the emitted radiation emerging from the capillary.

Lasers have been used successfully for machining, heat treating, welding and the like. In the subject invention, the laser can be used to heat treat the region inside the capillary bore to make it more resistive to erosion. This treatment would occur by subjecting the surface of the capillary bore region, as shown in one embodiment in FIG. 8 to one or more pulses of high intensity laser radiation, in the intensity region of approximately $10^6$ to approximately $10^{11}$ W/cm$^2$. The laser radiation would heat the entire bore region as it passes through the bore of the capillary. In some instances the lens can be adjusted along the axis to focus on different regions within the bore.

FIG. 8 shows an example of preparing the capillary bore. Experimentally it has been discovered that gas pressure pulses emanating from the capillary on firing the discharge can be substantially reduced in magnitude by preliminarily firing the discharge a few thousand times. The effect is to drive all condensed volatile materials out from the capillary bore walls. Alternatively, a heat treatment using high power laser radiation can be applied to the capillary before it is mated to the lamp assembly. FIG. 8 shows a heat treatment technique. A high power pulsed laser beam 800, such as one generated from a laser such as but not limited to an excimer laser, a Nd:YAG laser, a copper vapor laser, carbon dioxide laser, and the like, sufficient to produce fluences on the order of approximately $10^8$ W/cm$^2$ or higher at the capillary. Laser beam 800 will locally shock heat the capillary walls to near the melting point, is focussed by a converging lens 802 to a focal point 804 proximate and axially concentric to the capillary bore. The laser beam 800 would irradiate the bore region and produce sufficient heating to change the material structure of the bore to make it more durable and smooth than would be achieved by the process that formed the bore, such as the drilling process. Depending on the bore material used, laser pulses up to and larger than 1,000 or more can be used to achieve the required compensation change in the bore material. The concentrated light diverging just past the focus is intercepted by the capillary bore walls of the insulator 806 to be used in the EUV lamp assembly. Provided the F number of the lens is smaller than the length-to-diameter ratio of the capillary (approximately 6 or higher), most of the light will be intercepted by the bore and only a small fraction will pass through the bore. For complete coverage of the length of the capillary bore wall, the insulator can be translated axially and also flipped to present the opposite fact to the light.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A method of operating a capillary discharge source in the approximately 11 nm to approximately 14 nm wavelength region comprising the steps of:
   (a) forming a discharge within a capillary source having a bore size of approximately 1 mm, and at least one radiating gas, with a discharge current of approximately 2000 to approximately 10,000 amperes; and
   (b) radiating selected wavelength regions between approximately 11 to approximately 14 nm from the discharge source.

2. The method of operating the capillary discharge source of claim 1, wherein the gas includes:
xenon.

3. The method of operating the capillary discharge source of claim 1, wherein the gas includes:
an oxygen containing molecule to provide oxygen as the one radiating gas.

4. The method of operating the capillary discharge source of claim 1, further comprising:
a buffer gas.

5. The method of operating the capillary discharge source of claim 1, wherein total pressure in the capillary is within the range of:
approximately 0.1 to approximately 50 Torr.

6. The method of operating the capillary discharge source of claim 1, wherein the gas radiating the selected wavelength regions has a pressure of:
approximately 0.1 to approximately 20 Torr.

7. The method of operating the capillary discharge source of claim 1, wherein the gas includes:
a metal vapor radiating the selected wavelength regions.

8. The method of operating the capillary discharge source of claim 7, wherein the metal vapor has a pressure of:
approximately 0.1 to approximately 20 Torr.

9. The method of operating the capillary discharge source of claim 7, wherein the metal vapor is:
lithium.

10. The method of operating the capillary discharge source of claim 1, wherein the gas includes:
lithium radiating the selected wavelength region between approximately 11 to approximately 14 nm; and
helium as a buffer gas.

11. A method of operating a capillary discharge source in the approximately 11 to approximately 14 nm wavelength region comprising the steps of:
(a) forming a discharge across a capillary source having a bore size of approximately 0.5 to approximately 3 mm, and at least one radiating gas, with a discharge current density of up to approximately 1,300,000 Amperes/cm$^2$; and
(b) radiating selected wavelength regions between approximately 11 to approximately 14 nm from the discharge source.

12. The method of operating the capillary discharge source of claim 11, wherein the bore size further includes:
a length of approximately 1 to approximately 10 mm.

13. The method of operating the capillary discharge source of claim 11, wherein the gas includes:
xenon.

14. The method operating the capillary discharge source of claim 11, wherein the gas includes:
an oxygen containing molecule to provide oxygen as the one radiating gas.

15. The method of operating the capillary discharge source of claim 11, further comprising:
a buffer gas.

16. The method of operating the capillary discharge source of claim 11, wherein total pressure in the capillary is within the range of:
approximately 0.1 to approximately 50 Torr.

17. A method of pre-processing a capillary discharge source having an optical element that operates in the ultraviolet region, prior to operating the source, in order to prevent rupturing of the optical element or contaminating mirrors that receive radiation, comprising the steps of:

pre-conditioning interior bore surface walls of a capillary discharge source that operates in the ultraviolet region; and continuing the pre-conditioning until a selected impulse value is reached.

18. The method of pre-processing the capillary discharge source of claim 17, wherein the pre-conditioning step further includes:
a heat source.

19. The method of pre-processing the capillary discharge source of claim 18, wherein the heat source includes:
laser.

20. The method of pre-processing the capillary discharge source of claim 19, further including the steps of:
focussing the laser within the bore; and
operating the laser at a focussed intensity in the range of approximately $10^7$ to approximately $10^{11}$ Watts/cm$^2$.

21. The method of pre-processing the capillary discharge source of claim 18, wherein the laser is chosen from one of:
an excimer laser, a Nd:Yag laser, and a Copper Vapor laser.

22. The method of pre-processing the capillary discharge source of claim 17, wherein the selected value is:
less than approximately 20 Torr-$\mu$s.

23. The method of pre-processing the capillary discharge source of claim 17, wherein the pre-conditioning step further includes the step of:
initiating discharge current discharge pulses within the capillary with a second gas having a pressure range of approximately 1 to approximately 20 Torr.

24. The method of pre-processing the capillary discharge source of claim 17, wherein the pre-operation pulses includes:
approximately 3000 pulses.

25. A capillary discharge lamp source operating in the ultraviolet wavelength region, comprising:
a capillary constructed from a nonconducting and an insulating material; and
at least one gaseous species inserted in the capillary, wherein the capillary is used to generate ultraviolet discharges.

26. The capillary discharge lamp source of claim 25, further including
a metallic conductor on opposite sides of the capillary.

27. The capillary discharge lamp source of claim 26, wherein the metallic conductor is chosen from one of: molybdenum, Kovar, and stainless steel.

28. The capillary discharge lamp source of claim 25, wherein the nonconducting and the insulating material is chosen from one of:
quartz, saphire, aluminum nitride, silicon carbide, and alumina.

29. The capillary discharge lamp source of claim 25, wherein the capillary is
a segmented bore of alternating conductive and nonconductive materials.

30. A discharge lamp source operating the ultraviolet wavelength region comprising:

a capillary;

a first electrode on one side of the capillary;

a second electrode on a second side of the capillary opposite to the first side;

a pipe having a first end for supporting the second electrode and a second end;

a discharge port connected to the second end of the pipe;

a wick passing through the pipe from the discharge port to an portion of the pipe adjacent to but not within the capillary; and means for operating the capillary as a discharge source for generating ultraviolet wavelengths signals.

31. The capillary discharge source of claim 30, wherein the means for operating includes a lithium wetted mesh for operation as a heat pipe.

* * * * *